United States Patent
Chen et al.

(10) Patent No.: US 9,158,209 B2
(45) Date of Patent: Oct. 13, 2015

(54) METHOD OF OVERLAY PREDICTION

(71) Applicant: TAIWAN SEMICONDUCTOR MANUFACTURING COMPANY, LTD., Hsin-Chu (TW)

(72) Inventors: Li-Jui Chen, Hsinchu (TW); Fu-Jye Liang, Zhubei (TW); Hung-Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 368 days.

(21) Appl. No.: 13/656,067

(22) Filed: Oct. 19, 2012

(65) Prior Publication Data

US 2014/0111779 A1    Apr. 24, 2014

(51) Int. Cl.
*G01B 11/00* (2006.01)
*G03B 27/32* (2006.01)
*G03F 7/20* (2006.01)
*G03F 9/00* (2006.01)

(52) U.S. Cl.
CPC ........ *G03F 7/70608* (2013.01); *G03F 7/70616* (2013.01); *G03F 7/70633* (2013.01); *G03F 9/7003* (2013.01); *G03F 9/7034* (2013.01)

(58) Field of Classification Search
CPC ............ G03F 7/70608; G03F 7/70616; G03F 7/70633; G03F 7/70641; G03F 9/70; G03F 9/7003; G03F 9/7034; G03F 2009/005
USPC .................. 355/27, 52, 77; 356/399–401
See application file for complete search history.

(56) References Cited

U.S. PATENT DOCUMENTS

| | | | |
|---|---|---|---|
| 2004/0159397 A1* | 8/2004 | Bode et al. ................. | 156/345.5 |
| 2006/0114436 A1* | 6/2006 | Oesterholt et al. .............. | 355/55 |
| 2008/0316442 A1* | 12/2008 | Adel et al. ....................... | 355/52 |
| 2013/0090877 A1* | 4/2013 | Nagai ............................ | 702/95 |

* cited by examiner

*Primary Examiner* — Colin Kreutzer
(74) *Attorney, Agent, or Firm* — Haynes and Boone, LLP (57) ABSTRACT

A method includes receiving a substrate having a material feature embedded in the substrate, wherein receiving the substrate includes receiving a first leveling data and a first overlay data generated when forming the material feature, deposing a resist film on the substrate, and exposing the resist film using a predicted overlay correction data to form a resist pattern overlying the material feature on the substrate, wherein using the predicted overlay correction data includes generating a second leveling data and calculating the predicted overlay correction data using the first leveling data, the first overlay data, and the second leveling data.

20 Claims, 6 Drawing Sheets

METHOD OF OVERLAY PREDICTION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process is the result of various process changes and improvements, including more precise lithography. Such scaling down has also increased the complexity of processing and manufacturing ICs and, for these advances to be realized, similar developments in IC processing and manufacturing are needed.

As components become smaller and patterning techniques become more precise, the topography of the substrate on which the components are fabricated becomes more important. For example, if the topography of a semiconductor wafer becomes non-planar, or complicated, the result can have a negative impact on alignment performance of a lithography exposing tool. Further, the result can have a negative impact on an overlay of a resist pattern to a material feature embedded in the semiconductor wafer. Accordingly, what is needed is a method for improving a patterning process used to expose a substrate such as a semiconductor wafer.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
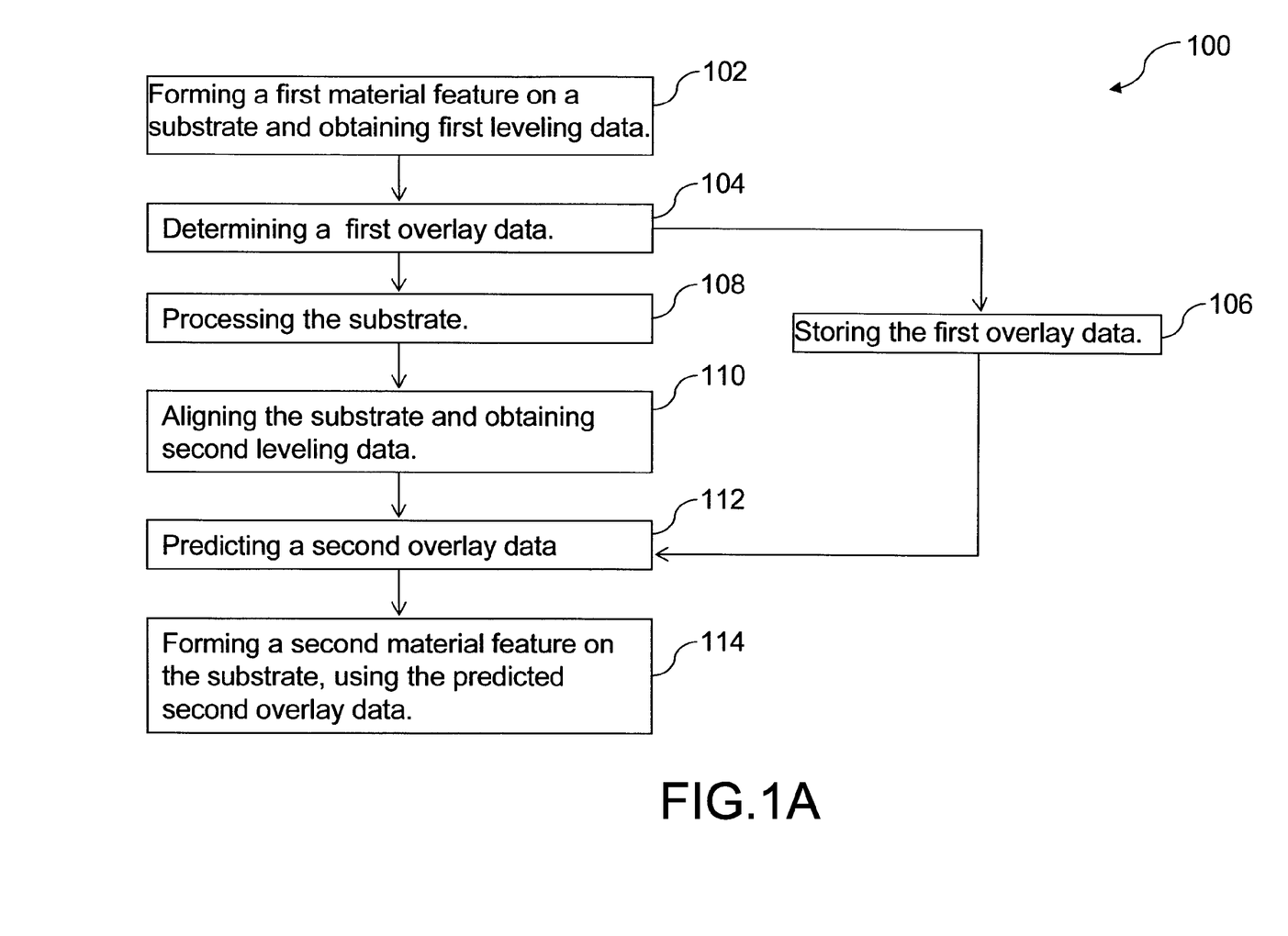
FIGS. 1A-1B are flow charts of an exemplary method of forming a resist pattern according to one or more embodiments.
Figure 1B:
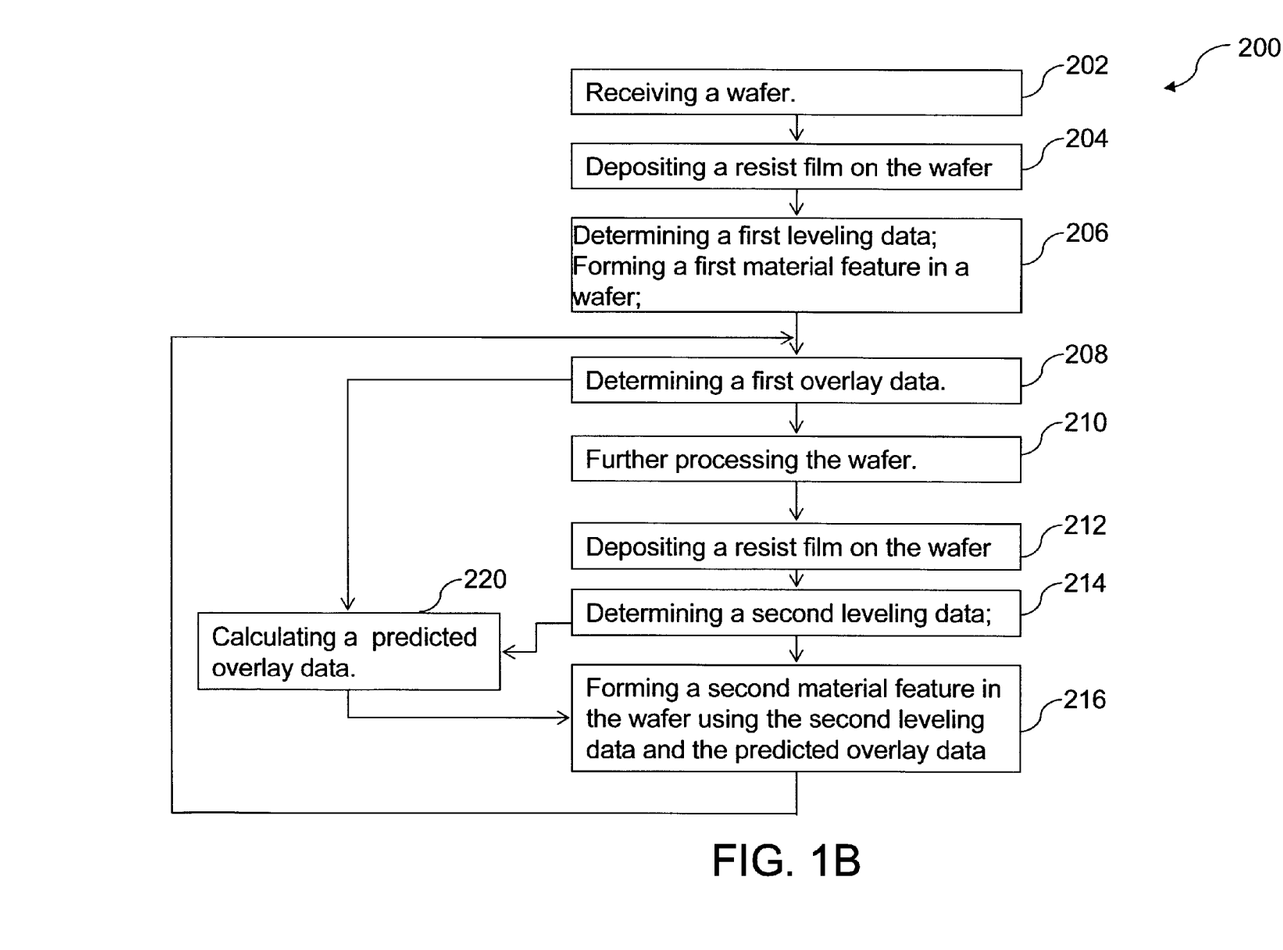

The following disclosure will describe methods for implementing one or more embodiments of the present disclosure, with reference to FIGS. 1A and 1B of the drawings. The following disclosure will also describe exemplary systems for implementing the method of FIGS. 1A and 1B, with reference to FIGS. 2A and 2B of the drawings. Afterwards and with respect to FIGS. 3A-3E, 4A-4E and 5, the following disclosure will provide examples corresponding to the different embodiments of the method of FIG. 1B.

Referring to FIG. 1A, a method of patterning a substrate according to one or more embodiments of the present disclosure is designated with the reference number 100. The method is used to form multiple patterns on the substrate, with the patterns being aligned with each other. Execution begins at step 102, where the substrate is provided to a tool and scanned to determine an overall flatness of the substrate at that tool. This results in a first leveling data being obtained for the substrate. In addition, a first material feature (e.g., a pattern) is formed on the substrate. At step 104, a first overlay data for the first material feature is determined, and at step 106, is stored for future use. The first overlay data is generated when performing an overlay measurement on the substrate using an overlay tool.

The method 100 proceeds to step 108 in which one or more processing operations are performed on the substrate, such as depositing various film layers and/or removing portions of the deposited layers.

At step 110, an alignment operation is performed. The alignment operation aligns the first material feature formed in the substrate to a second material feature to be formed in the substrate. The alignment operation includes a leveling operation to generate a second leveling data. At step 112, the second leveling data from step 110 is used, along with the first overlay data from 106, to predict a second overlay data. At step 114, the second material feature is formed on the substrate. The second material feature is further aligned with the first material feature using the second overlay data.

Figure 2A:
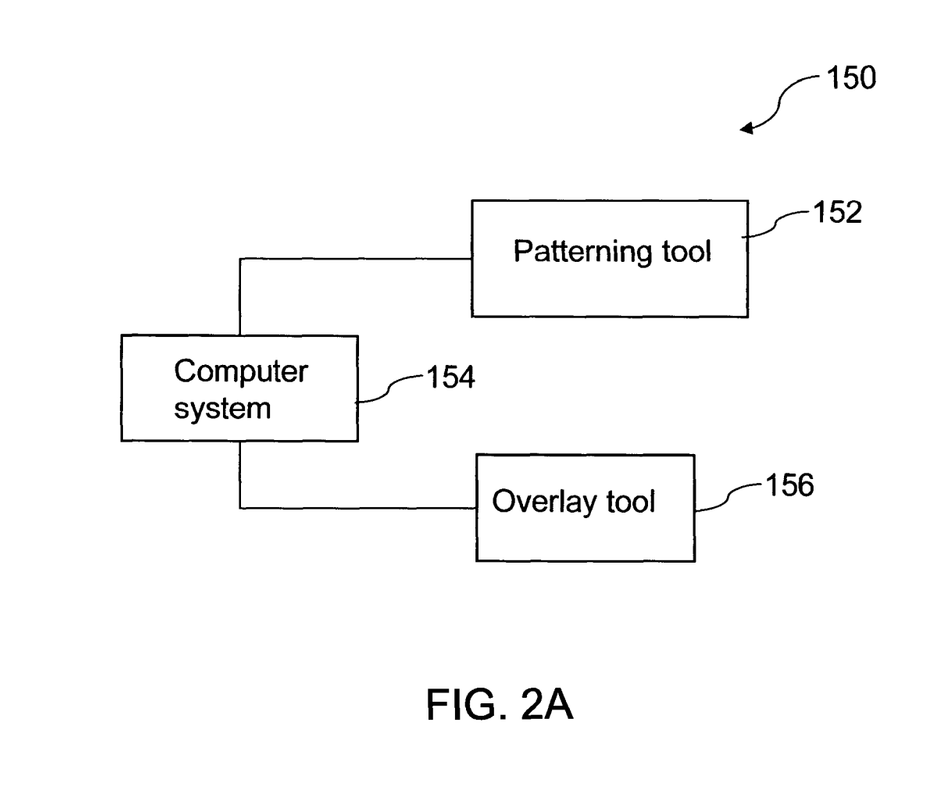
FIGS. 2A-2B are diagrams of a lithography exposing tool for benefiting from one or more embodiments.
Figure 2B:
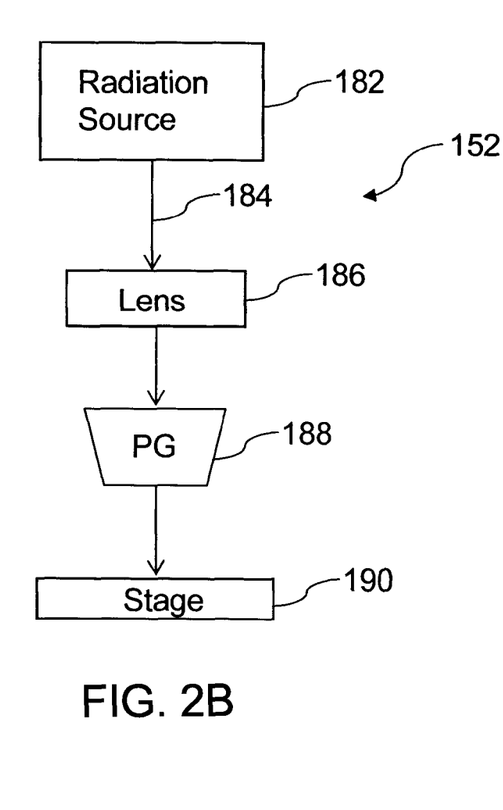

FIG. 2A describes an embodiment of an overlay system 150 for implementing the method 100 of FIG. 1. The system 150 includes a patterning tool 152, a computer system 154, and an overlay tool 156. FIG. 2B describes an embodiment of the patterning tool 152, and is discussed separately below. The computer 154 is a standard, general-purpose computer, including a processor, memory, and interface. The computer may be a single computer or a distributed computer, and connects to various components of the lithography system 152 and the overlay tool 156, including but not limited to the connections shown in FIG. 2A. The computer 154 includes one or more software programs for calculating and predicting overlay data.

The overlay tool 156 is configured to connect to the computer system 154. The overlay tool 156 receives a substrate with, performs an overlay measurement of a material feature of the substrate, and sends the overlay measurement data to the computer. The overlay tool can be a conventional scanner device, such as is commonly used in after-develop inspection (ADI).

Referring to FIG. 2B, for the sake of further example, the patterning tool 152 is a lithography system. The lithography system 152 is used for exposing a resist film deposited on a substrate. In the present embodiment, a lithography exposing system is also referred to as an exposing tool. The lithography exposing system 152 includes a radiation source 182, a radiation beam 184, a condense lens 186, a pattern generator 188, and a stage 190. However, other configurations and inclusion or omission of the exposing system 152 may be possible.

In the present example, the radiation source 182 includes a source providing the radiation beam 184. The radiation source 182 includes a light source in an optical lithography exposing system or a charged particle source in a charged particle lithography exposing system. For example, in an optical lithography exposing system, the radiation source 182 includes a mercury lamp providing a light with UV wavelength, such as G-line (436 nm) or Mine (365 nm), or a laser providing a light with DUV wavelength, such as 248 nm, 193 nm, or 157 nm, or EUV wavelength at 13.7 nm. In another example, in a charged particle lithography exposing system, the radiation source 182 includes an electron source providing an electron beam or an ion source providing an ion beam.

The condense lens 186 includes a plurality of optical lenses in an optical lithography exposing system or a plurality of electromagnetic lenses in a charged particle lithography exposing system. The condense lens 186 is configured to guide the radiation beam 184 parallel with the pattern generator 188 to generate a patterned radiation beam. In one embodiment of an optical lithography exposing system, the pattern generator 188 includes a mask. The mask blocks a portion of the radiation beam 184 and provides an aerial image of the radiation beam 184. The mask includes a binary mask (BIM), or a phase shift mask (PSM). The phase shift mask may be an alternative phase shift mask (alt. PSM) or an attenuated phase shift mask (att. PSM). A mask is also referred to as a photomask or a reticle.

The pattern generator 188 also includes a plurality of optical objective lenses to guide the aerial image of the radiation beam 184 to a resist film deposited on a substrate secured on the stage 190. In the present embodiment, an optical lens may include a transmittance lens or a reflectance lens. In another embodiment of a charged particle lithography exposing system, the pattern generator 188 includes a plurality of apertures generating patterned charge particles. The pattern generator 188 also includes a plurality of electromagnetic objective lenses to guide the patterned charge particles to a resist film deposited on a substrate secured on the stage 190.

The substrate stage 190 includes motors, roller guides, and tables; secures a substrate by vacuum; and provides accurate position and movement of a substrate in X, Y, and Z directions during alignment, focus, leveling and exposure steps in the lithography exposing system 152 so that an image of the mask or an image of patterned electron beam is transferred onto the substrate in a repetitive fashion. The lithography exposing system 152, or portions thereof, may include additional items, such as a vacuum unit, an environment control unit, and a wafer handling unit.

Referring again to FIG. 2A, the patterning tool 152 provides a first leveling data and a second leveling data to the computer system 154 for calculating a predicted overlay data. The patterning tool 152 receives the predicted overlay data as an overlay correction data to expose a resist film deposited on a wafer having a material feature embedded in the wafer to form a resist pattern on the wafer so that an overlay error of the resist pattern to the material feature is minimized. The patterning tool 152 also provides a wafer with a resist pattern formed on a wafer to the overlay tool 156 performing an overlay measurement for a first overlay data.

FIG. 1B, expands on the method 100 of FIG. 1A, and describes a method 200 of forming a resist pattern on a substrate according to one or more embodiments of the present disclosure, using the overlay system 150 and the lithography exposing system 152 of FIGS. 2A and 2B, respectively.

The method 200 begins at step 202 by receiving a wafer. For the sake of example, the wafer includes a semiconductor substrate and may include one or more conductive and non-conductive thin films over the substrate. The semiconductor substrate includes silicon. Alternatively or additionally, the wafer includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride.

Continuing with the example, the semiconductor substrate may include doped features, such as n-type wells and/or p-type wells, formed by ion implantation or diffusion or strained features formed by an epitaxial (EPI) growth. The material feature may also include various isolation features, such as shallow trench isolation (STI), formed by a process, such as a process including etching to form various trenches and then depositing to fill the trench with a dielectric material.

The method 200 proceeds to step 204 by depositing a resist film on the wafer, for example, by a spin-on coating process. In the present embodiments, a resist film is also referred to as a photo resist film. A resist film may include a single resist layer or multiple resist layers. Step 204 may include performing a dehydration process before applying the resist film on the wafer, which can enhance an adhesion of the resist film to the wafer. The dehydration process may include baking the wafer at a high temperature for duration of time, or applying a chemical such as hexamethyldisilizane (HMDS) to the wafer under high temperature. The step 204 may also include a soft bake (SB), which drive solvents out of the resist film deposited on the wafer and can increase mechanical strength of the resist film. The step 204 may include applying a bottom anti-reflective coating (BARC) for improving a resist pattern profile.

At step 206, the wafer is provided to an exposure tool, where a first leveling data is determined and a first material feature (e.g., pattern) is formed on the wafer. In the present example, the wafer is placed on a chuck in a lithography exposing system 152 (FIG. 2B), and a topography of the upper surface of the wafer is determined. Leveling data is discussed further below, with reference to step 214 and FIGS. 3A-3E, 4A-4E and 5. After determining the first leveling data, the lithography exposing system 152 exposes the resist film to form a first resist pattern. Step 206 includes applying a developer, such as tetra-methyl ammonium hydroxide (TMAH), on the exposed resist film. Step 206 may include a post expose bake (PEB), a post develop bake (PDB), or both. Step 208 also includes a final rinse process.

At step 208, a first overlay data is determined. The overlay measurement provides a resist pattern shift $D_X$ in X direction and a resist pattern shift $D_Y$ in Y direction at measurement point (X, Y) of a wafer coordinate system. The $D_X$ and $D_Y$ are used for calculating a predicted overlay data as described in equations 1-5. Step 208 includes performing the measurement at multiple points at inter-field level on a substrate. Step 208 also includes performing the measurement at multiple points at intra-field level on a substrate. Step 208 further includes forwarding the $D_X$ and $D_Y$ to step 220 calculating a predicted overlay data for a next level resist pattern. Overlay data is discussed further below, with reference to step 220 and FIGS. 3A-3E, 4A-4E and 5.

At step 210, the wafer experiences a plurality of processes, such as an etching process, an implant/diffusion process, a film deposition process (e.g. chemical vapor deposition (CVD), physical vapor deposition (PVD), or electroplating), or chemical mechanical polishing process (CMP). The processes may impact the resist pattern overlay accuracy to the material feature.

The method 200 proceeds to step 212 by depositing another resist film on the wafer. This step can be similar to step 204, discussed above.

Execution proceeds to step 214 by first performing an alignment operation. The alignment operation aligns a patterned electromagnetic wave image projected on the resist film to a (previous) material feature (pattern) formed in the wafer. The alignment operation includes performing a stage alignment to setup relations between TIS plate and SPM using an advanced alignment method. The alignment operation also includes performing a coarse wafer alignment operation using the advanced alignment method. The coarse wafer alignment operation includes using one or more alignment marks formed in the wafer. The alignment operation also includes performing a fine wafer alignment operation.

Step 214 also includes performing a leveling operation to generate the second leveling data. The leveling operation is performed on the resist film deposited on the wafer secured on the wafer stage. The leveling operation brings the resist film into a focus range of a patterned electromagnetic wave image projected on the resist film. The leveling operation includes a zeroing operation using a zero sensor to level the resist film. The zeroing operation also includes a coarse zeroing, a fine zeroing, a phase capture, and a bright field (BF) zeroing. For example, a leveling of the resist film is brought from approximate 10 μm at coarse zeroing to approximate 0.1 μm at BF zeroing. The leveling operation further includes generating a global leveling contour (GLC) of the resist film deposited on the wafer. Generating the GLC includes measuring the resist film edge topography. The leveling operation also includes generating a Z-map. Generating the Z-map includes measuring local resist height topography using a leveling sensor.

Step 214 includes providing the second leveling data to step 220 for calculating a predicted overlay data using the first leveling data, the second leveling data, and the first overlay data.

The following equations described for 220 are the typical Overlay correction, as well as alignment correction parameters (so-called "6 parameters). However, as the evolution of lens development, the overlay correction capability has been extended to "per-field correction". Step 220 calculates the predicted overlay data using the first leveling data and the first overlay data generated when forming a previous resist pattern (first resist pattern) associated with a (previous) material feature embedded in the wafer, and the second leveling data generated at step 214.

In the present embodiment, step 220 includes generating inter-field or grid parameters, such as inter-field translation in X, Y direction, inter-field symmetrical and asymmetrical magnification, and inter-field symmetrical and asymmetrical rotation, using the first overlay data. Step 220 also includes generating intra-field parameters, such as intra-field translation in X, Y direction, intra-field symmetrical and/or asymmetrical magnification, and intra-field symmetrical and/or asymmetrical rotation, using the first overlay data. In the present embodiment, inter-field parameters are also referred to as inter-field overlay correction data and intra-field parameters are also refereed to as intra-field overlay correction data.

In the present embodiments, the inter-field parameters are calculated by the following equations:

$$D_X = T_X - (R_S - R_A)*Y + (M_S + M_A)*X + X\_residual \qquad \text{eq. 1}$$

$$D_Y = T_Y - (R_S - R_A)*X + (M_S + M_A)*Y + Y\_residual \qquad \text{eq. 2}$$

Wherein $D_X$ and $D_Y$ are first overlay measurement data in X and Y directions, $T_X$ and $T_Y$ are inter-field translation in X and Y directions, $R_S$ and $R_A$ are inter-field symmetrical and asymmetrical rotation, and $M_S$ and $M_A$ are inter-field symmetrical and asymmetrical magnification, at a point (X, Y) of a wafer coordinate system respectively. X_residual and Y_residual are high order terms.

In the present embodiments, intra-field parameters are calculated by following equations:

$$d_x = t_x - (r_s - r_a)*y + (m_s + m_a)*x + x\_residual \qquad \text{eq. 3}$$

$$d_y = t_y - (r_s - r_a)*x + (m_s + m_a)*y + y\_residual \qquad \text{eq. 4}$$

Wherein $d_x$ and $d_y$ are first intra-filed overlay data in x and y directions, $t_x$ and $t_y$ are intra-field translation in X and Y directions, $r_s$ and $r_a$ are intra-field symmetrical and asymmetrical rotation, and $m_s$ and $m_a$ are intra-field symmetrical and asymmetrical magnification, at a point (x, y) of an intra-field coordinate system respectively. The $d_x$ and $d_y$ can be calculated from the $D_x$ and $D_y$ by removing a grid effect respectively. x_residual and y_residual are high order terms.

Step 220 includes generating a leveling difference data between the first leveling data and the second leveling data. Step 220 also includes generating a Z-height map by performing a 2-dimension (2D) polynomial fitting on the leveling difference data. Step 220 includes generating a predicted overlay data by modifying the inter-field parameters and the intra-field parameters using the Z-height map.

In the present embodiments, calculating the inter-field parameters, the intra-field parameters, and the Z-height map, and modifying the inter-field parameters and the intra-field parameters using the Z-height map are performed on a computer. The predicted overlay data can be expressed as following:

$$P = F\{P_{Z1,Z2}[(X,Y),(x,y)], P_O[(X,Y),(x,y)],\} \qquad \text{eq. 5}$$

Wherein P is a predicted overlay data, $P_O[(X,Y), (x, y)]$ includes the inter-field parameter and intra-field parameters, and $P_{Z1,Z2}[(X,Y), (x,y)]$ includes a leveling change impact on the inter-field parameter and intra-field parameters. The computer will be discussed in more detail below.

Step 220 also includes providing the predicted overlay data to a lithography system as an overlay correction data to expose a resist film deposited on a wafer having a material feature embedded in the wafer to form a resist pattern overlying the material feature embedded in the wafer. In the present embodiments, a predicted overlay data is also referred to as a predicted overlay correction data.

Figures 3A, 3B, 3C, 3D, 3E:
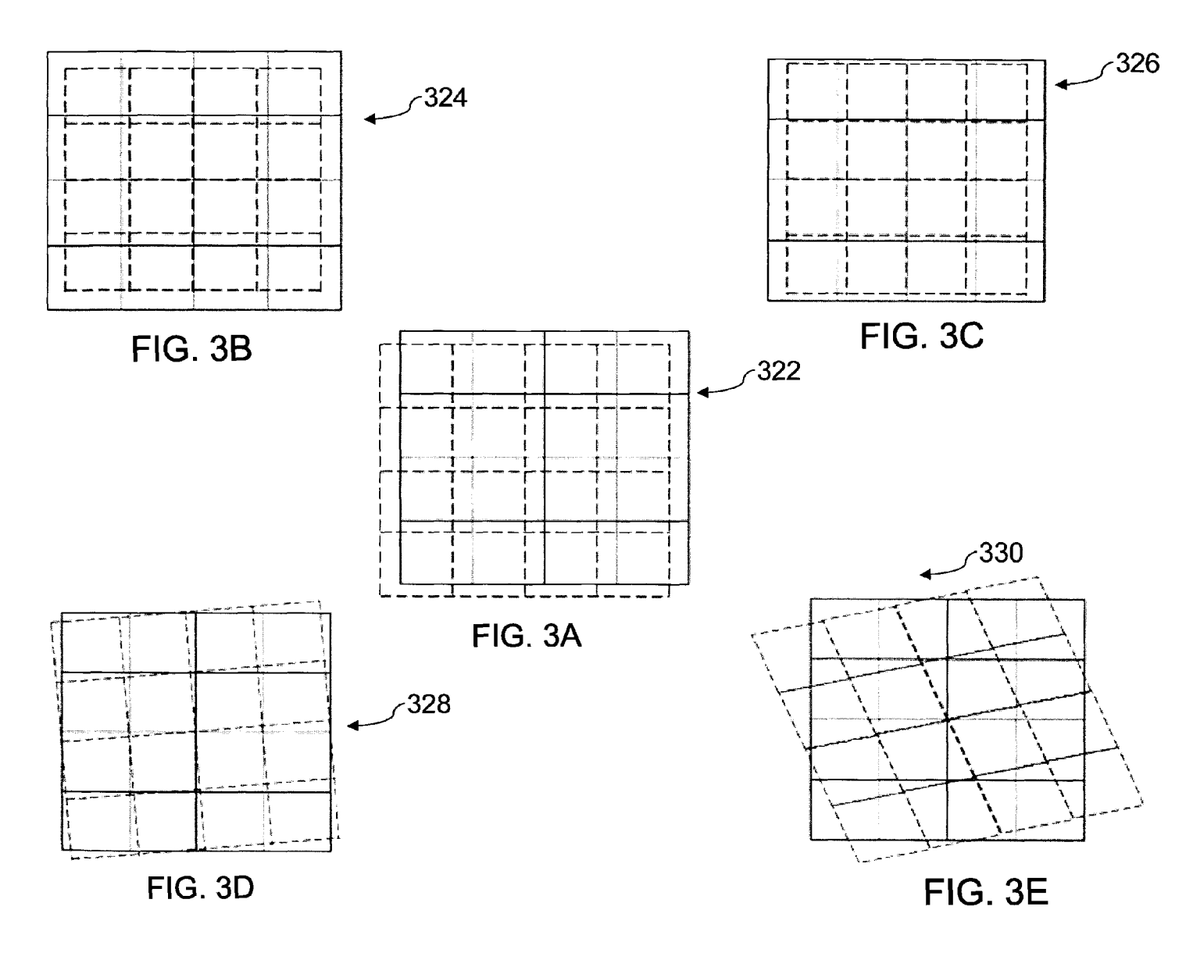
FIGS. 3A-3E and 4A-4E are examples of inter-field parameters and intra-field parameters according to one or more embodiments.

Referring to FIGS. 3A-3E and 4A-4E, examples of inter-field parameters and intra-field parameter are illustrated. For example, inter-field parameters includes an inter-field translation 322 in X/Y direction (e.g. $T_X$ and $T_Y$) (FIG. 3A), a symmetrical inter-field magnification 324 (e.g. $M_S$) (FIG. 3B), an asymmetrical inter-field magnification 326 (e.g. $M_A$) (FIG. 3C), a symmetrical inter-field rotation 328 (e.g $R_S$) (FIG. 3D), and an asymmetrical inter-field magnification 330 (e.g. $R_A$) (FIG. 3E).

Figures 4A, 4C, 4E:
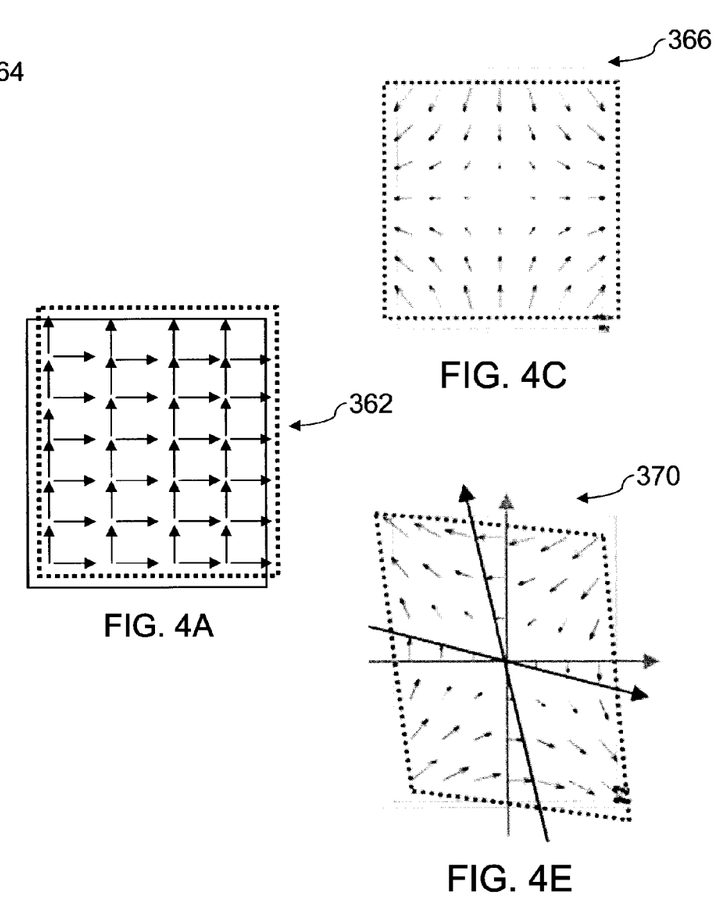
Figure 4B:
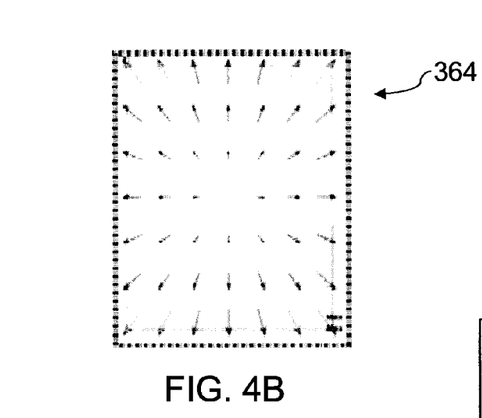
Figure 4D:
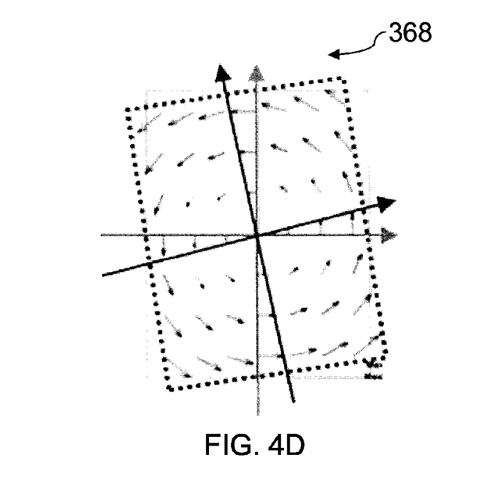

As shown in FIGS. 4A-4C, the intra-field parameters includes an intra-field translation 362 in X/Y direction (e.g. $t_X$ and $t_Y$) (FIG. 4A), a symmetrical intra-field magnification 364 (e.g. $m_s$) (FIG. 4B), an asymmetrical intra-field magnification 366 (e.g. $m_a$) (FIG. 4C), a symmetrical intra-field rotation 368 (e, g $r_s$) (FIG. 4D), and an asymmetrical intra-field magnification 370 (e.g. $r_s$) (FIG. 4E). "Translation" means the overlay offset in X direction or Y direction. There is no separation between intra-field and inter-field Translation because they are the same.

Figure 5:
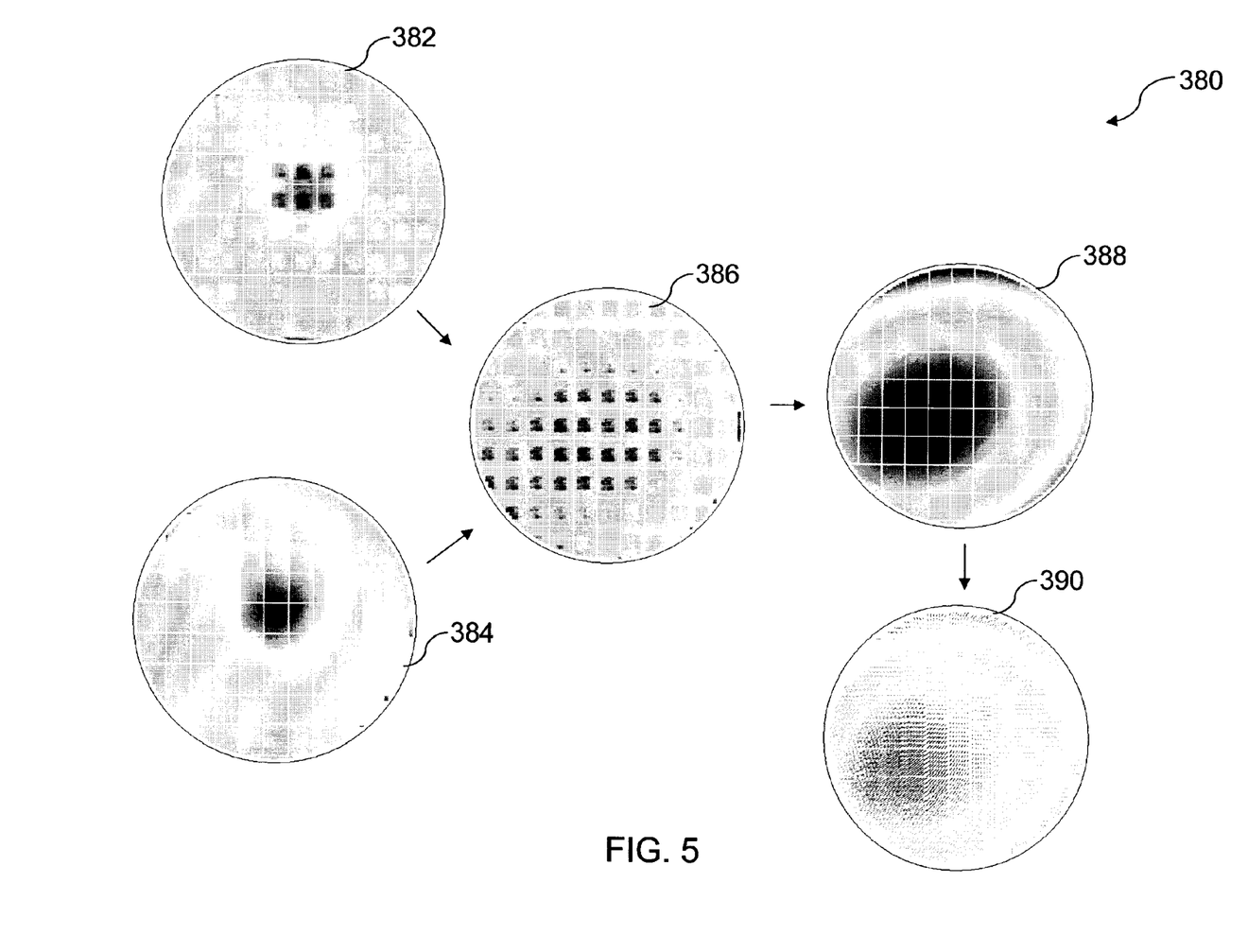
FIG. 5 is examples of using leveling data for benefiting from one or more embodiments.

Referring to FIG. 5, examples of calculating a predicted overlay data 390 using a first leveling data and second leveling data are illustrated according to one or more embodiments. A first leveling data 382 and a second leveling data 384 are modeled to generate a leveling difference data 386. A Z-height map 388 is generated by a 2D fitting from the leveling difference data 386. A predicted overlay data 390 is calculated by modifying the inter-field parameters and intra-field parameters using the Z-height map 388. The predicted overlay data 390 includes an inter-field correction data and an intra-field correction data.

Referring back to FIG. 2B, the method 200 proceeds to step 216 by forming a resist pattern overlying and aligned with the first material feature from step 206. This operation can be similar to step 206, except the predicted overlay data can be used to further enhance the alignment of the wafer in the lithography exposing system 152.

To the extent more lithography operation is to be performed, execution proceeds to step 208 where a new overlay data is determined. This can then be used to predict additional overlay data for subsequent exposure operations. Additional steps can be provided before, during, and after the method 200, and some of the steps described can be replaced, eliminated, or moved around for additional embodiments of the method 200.

Thus, the present disclosure describes a method of forming a resist pattern. The method includes receiving a substrate having a material feature embedded in the substrate, wherein receiving the substrate includes receiving a first leveling data and a first overlay data generated when forming the material feature, depositing a resist film on the substrate, and exposing the resist film using a predicted overlay correction data to form a resist pattern overlying the material feature on the substrate, wherein using the predicted overlay correction data includes generating a second leveling data and calculating the predicted overlay correction data using the first leveling data, the first overlay data, and the second leveling data. The method further includes developing the exposed resist film. The method further includes performing an overlay measurement to the first overlay data. Calculating the predicted overlay correction data includes calculating an inter-field correction data of the predicted overlay correction data, modifying the inter-field correction data using a leveling difference data between the first leveling data and the second leveling data, and calculating a Z-height map using the leveling difference data. Calculating the predicted overlay correction data also includes calculating an intra-field correction data of the predicted overlay correction data, modifying the intra-field correction data using a leveling difference data between the first leveling data and the second leveling data, and calculating a Z-height map using the leveling difference data.

In one or more embodiments, a method of forming a resist pattern is described. The method includes receiving a substrate having a material feature embedded in the substrate, wherein receiving the substrate includes receiving a first leveling data and a first overlay data generated when forming a first resist pattern associated with the material feature on the substrate, depositing a resist film on the substrate, and exposing the resist film according to a pattern using a predicted overlay correction data to form a second resist pattern overlying the material feature on the substrate, wherein using the predicted overlay correction data includes generating a second leveling data and calculating the predicted overlay correction data using the first leveling data, the first overlay data, and the second leveling data. The method further includes performing an overlay measurement. Calculating the predicted overlay correction data includes calculating an inter-field correction data of the predicted overlay correction data using the first overly data, modifying the inter-field correction data using a leveling difference data between the first leveling data and the second leveling data, and comprising calculating a Z-height map using the leveling difference data. Calculating the predicted overlay correction data also includes calculating an intra-field correction data of the predicted overlay correction data using a first overlay data, modifying the intra-field correction data using a leveling difference data between the first leveling data and the second leveling data, and calculating a Z-height map using the leveling difference data.

In some embodiments, a setup for forming a resist pattern is described. The method includes exposing a first pattern on the substrate and obtaining a first leveling data, determining a first overlay data, processing the substrate with the first pattern, aligning the processed substrate with a second pattern and obtaining a second leveling data, predicting a second overlay data from the second leveling data and the first overlay data, and exposing the second pattern on the substrate, using the second overlay data. The first and second leveling data are z-height maps, corresponding to a top surface of the substrate. The substrate is a resist-coated wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a resist pattern, the method comprising:
    receiving a substrate having a material feature disposed on the substrate, wherein receiving the substrate includes receiving a first leveling data associated with a first photoresist film and a first overlay data associated with patterning the first photoresist film, and wherein the patterned first photoresist film is used to form the material feature;
    depositing a second photoresist film on the substrate;
    obtaining second leveling data associated with the second photoresist film; and
    exposing the second photoresist film using a predicted overlay correction data to form a resist pattern overlying the material feature on the substrate, wherein the predicted overlay correction data is determined based on the first leveling data, the first overlay data, and the second leveling data, and wherein the predicted overlay correction data accounts for an effect of a leveling difference between the first leveling data and the second leveling data.

2. The method of claim 1, further comprising developing the exposed second photoresist film.

3. The method of claim 1, further comprising performing an overlay measurement to produce the first overlay data.

4. The method of claim 1, wherein calculating the predicted overlay correction data includes calculating an inter-field correction data of the predicted overlay correction data.

5. The method of claim 4, further comprising modifying the inter-field correction data using the leveling difference between the first leveling data and the second leveling data.

6. The method of claim 5, further comprising calculating a Z-height map using the leveling difference.

7. The method of claim 1, wherein calculating the predicted overlay correction data includes calculating an intra-field correction data of the predicted overlay correction data.

8. The method of claim 7, further comprising modifying the intra-field correction data using the leveling difference between the first leveling data and the second leveling data.

9. The method of claim 8, further comprising calculating a Z-height map using the leveling difference.

10. A method of forming a resist pattern, the method comprising:
   receiving a substrate having a material feature disposed on the substrate, wherein receiving the substrate includes receiving a first leveling data corresponding to a first resist film and a first overlay data generated when forming a first resist pattern of the first resist film, wherein the first resist film is used to form the material feature on the substrate;
   deposing a second resist film on the substrate;
   measuring the second resist film to obtain second leveling data; and
   exposing the second resist film according to a pattern using a predicted overlay correction data to form a second resist pattern overlying the material feature on the substrate, wherein the predicted overlay correction data is determined based on using the first leveling data, the first overlay data, and the second leveling data, and wherein the predicted overlay correction data is further determined based on an effect of a leveling difference between the first leveling data and the second leveling data.

11. The method of claim 10, further comprising performing an overlay measurement to obtain the first overlay data.

12. The method of claim 10, wherein calculating the predicted overlay correction data includes calculating an inter-field correction data of the predicted overlay correction data using the first overlay data.

13. The method of claim 12, further comprising modifying the inter-field correction data using the leveling difference between the first leveling data and the second leveling data.

14. The method of claim 13, further comprising calculating a Z-height map using the leveling difference.

15. The method of claim 10, wherein calculating the predicted overlay correction data includes calculating an intra-field correction data of the predicted overlay correction data using the first overlay data.

16. The method of claim 15, further comprising modifying the intra-field correction data using the leveling difference between the first leveling data and the second leveling data.

17. The method of claim 16, further comprising calculating a Z-height map using the leveling difference.

18. A method for patterning a substrate, the method comprising:
   obtaining first leveling data for a first resist disposed on the substrate;
   exposing the first resist to form a first pattern on the substrate;
   determining a first overlay data associated with the patterned first resist;
   processing the substrate with the first pattern;
   aligning the processed substrate with a second pattern and obtaining a second leveling data for a second resist disposed on the substrate;
   determining a leveling difference between the first resist and the second resist based on the first leveling data and the second leveling data;
   predicting a second overlay data from the first leveling data, the second leveling data and the first overlay data, wherein the second overlay data accounts for the leveling difference; and
   exposing the second resist to form the second pattern on the substrate, using the second overlay data.

19. The method of claim 18, wherein the first and second leveling data are z-height maps, corresponding to a top surface of the substrate.

20. The method of claim 18, wherein the substrate is a resist-coated wafer.

* * * * *